(12) United States Patent
Suwa et al.

(10) Patent No.: US 12,495,585 B2
(45) Date of Patent: Dec. 9, 2025

(54) SEMICONDUCTOR DEVICE HAVING CONTROL ELECTRODES IN TERMINATION REGION

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takeshi Suwa, Kawasaki Kanagawa (JP); Tomoko Matsudai, Tokyo (JP); Yoko Iwakaji, Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 586 days.

(21) Appl. No.: 17/889,945

(22) Filed: Aug. 17, 2022

(65) Prior Publication Data
US 2023/0282692 A1    Sep. 7, 2023

(30) Foreign Application Priority Data

Mar. 2, 2022  (JP) .................................. 2022-031628
Jul. 5, 2022   (JP) .................................. 2022-108219

(51) Int. Cl.
*H10D 62/10*    (2025.01)
*H10D 12/00*    (2025.01)
*H10D 64/00*    (2025.01)

(52) U.S. Cl.
CPC ......... *H10D 62/107* (2025.01); *H10D 12/481* (2025.01); *H10D 64/112* (2025.01)

(58) Field of Classification Search
CPC .. H10D 62/107; H10D 12/481; H10D 64/112; H10D 62/106; H10D 62/112
(Continued)

(56) References Cited

U.S. PATENT DOCUMENTS 6,124,628 A     9/2000 Fujihira et al.
9,570,553 B2 *  2/2017 Noebauer ............ H10D 64/518
(Continued)

FOREIGN PATENT DOCUMENTS

JP    H04-48652 A    2/1992
JP    H09-55498 A    2/1997
(Continued)

*Primary Examiner* — Mohammad M Hoque
(74) *Attorney, Agent, or Firm* — Kim & Stewart LLP

(57) ABSTRACT

A semiconductor device includes a semiconductor part, a first electrode, first and second control electrodes. The first electrode and the first control electrode are provided in an active region. The second control electrode is provided in a termination region. The semiconductor part including first and third layers of a first conductivity type, and second and fourth layers of a second conductivity type. The first layer is provided in the active and termination regions. The second layer is provided between the first layer and the first electrode, and faces the first control electrode via a first insulating film. The third layer is provided between the second layer and the first electrode. The fourth-layers are provided on the first layer in the termination region. The first layer includes a portion extending between the fourth layers. The second control electrode faces the portion of the first layer via a second insulating film.

11 Claims, 12 Drawing Sheets

(58) Field of Classification Search
USPC .......................................................... 257/139
See application file for complete search history.

(56) References Cited

U.S. PATENT DOCUMENTS

| | | |
|---|---|---|
| 2013/0207158 A1 | 8/2013 | Arai et al. |
| 2014/0197476 A1* | 7/2014 | Shimatou ............ H10D 62/106 |
| | | 257/329 |
| 2023/0143787 A1* | 5/2023 | Nishimura ........... H10D 12/481 |
| | | 257/470 |

FOREIGN PATENT DOCUMENTS

| | | |
|---|---|---|
| JP | 2000-124442 A | 4/2000 |
| JP | 2013-179251 A | 9/2013 |
| JP | 2014-063799 A | 4/2014 |

* cited by examiner

Snapback

SEMICONDUCTOR DEVICE HAVING CONTROL ELECTRODES IN TERMINATION REGION

CROSS-REFERENCE TO RELATED APPLICATIONS

This application is based upon and claims the benefit of priority from Japanese Patent Application No. 2022-031628, filed on Mar. 2, 2022, and Japanese Patent Application No. 2022-108219, filed on Jul. 5, 2022; the entire contents of all of which are incorporated herein by reference.

FIELD

Embodiments relate to a semiconductor device.

BACKGROUND

It is desirable for a power control semiconductor device to have large breakdown immunity. Thus, it is important to appropriately control the breakdown voltage of the termination region and the so-called snapback characteristic.

DETAILED DESCRIPTION

Figure 1A:
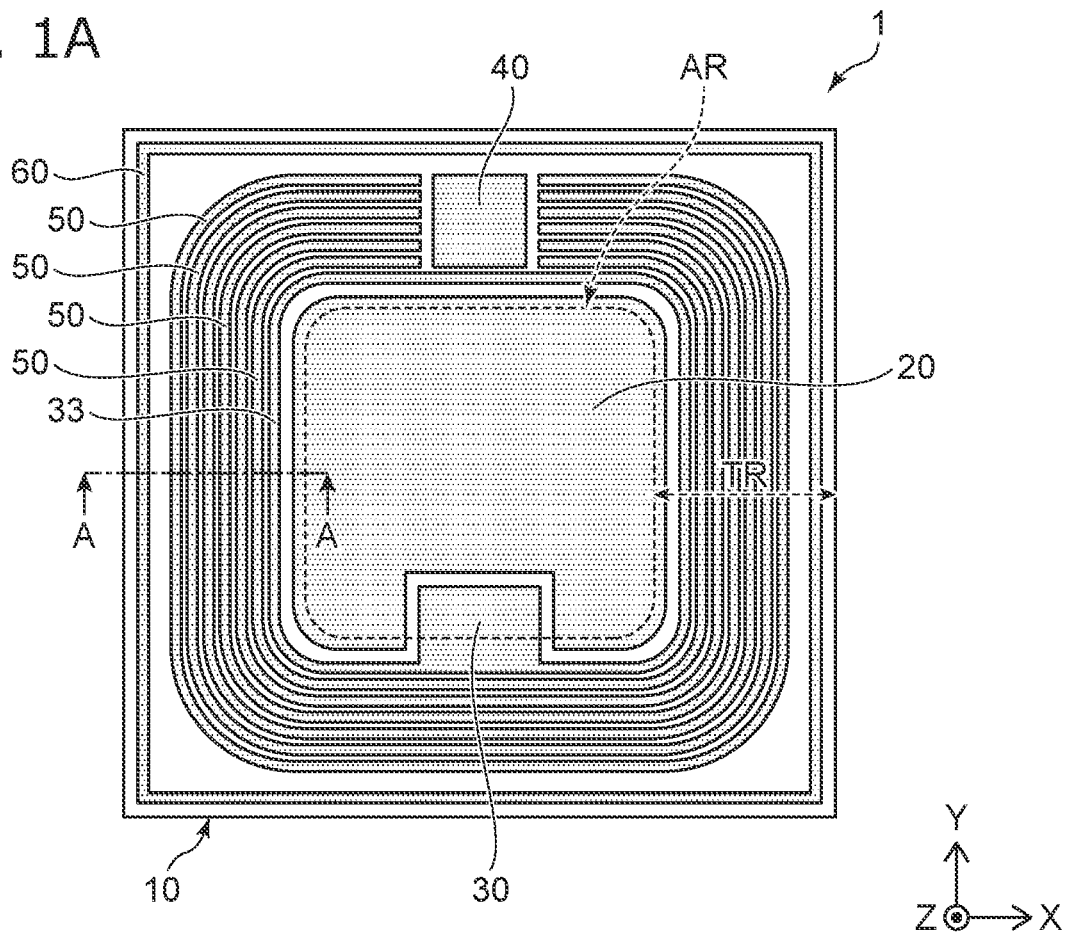
FIGS. 1A and 1B are schematic views showing a semiconductor device according to an embodiment.

According to one embodiment, a semiconductor device includes a semiconductor part, a first electrode, a first control electrode, at least one second control electrode, a first control pad, and a second control pad. The semiconductor part includes an active region and a termination region. The termination region surrounds the active region in a front surface of the semiconductor part. The first electrode is provided on the front surface of the semiconductor part in the active region. The first control electrode is provided in the active region. The first control electrode faces the semiconductor part via a first insulating film. The second control electrode provided on the termination region with a second insulating film interposed. The first control pad is provided on the front surface of the semiconductor part. The first control pad is apart from the first electrode. The first control pad is electrically connected to the first control electrode. The second control pad is provided on the front surface of the semiconductor part. The second control pad being apart from the first electrode and the first control pad. The second control pad is electrically connected to the second control electrode. The semiconductor part including a first semiconductor layer of a first conductivity type, a second semiconductor layer of a second conductivity type, a third semiconductor layer of the first conductivity type and a plurality of fourth semiconductor layers of the second conductivity type. The first semiconductor layer is provided in the active region and extends into the termination region. The second semiconductor layer is provided between the first semiconductor layer and the first electrode in the active region. The second semiconductor layer faces the first control electrode via the first insulating film. The third semiconductor layer is provided between the second semiconductor layer and the first electrode. The third semiconductor layer is partially provided on the second semiconductor layer and electrically connected to the first electrode. The plurality of fourth semiconductor layers are provided on the first semiconductor layer in the termination region. The fourth semiconductor layers are apart from each other and surround the active region in the front surface of the semiconductor part. The plurality of fourth semiconductor layers includes a first fourth-semiconductor layer and a second fourth-semiconductor layer. The second fourth-semiconductor layer is adjacent to the first fourth-semiconductor layer. The second fourth-semiconductor layer surrounds the second semiconductor layer and the first fourth-semiconductor layer. The first semiconductor layer includes a portion extending between the first fourth-semiconductor layer and the second fourth-semiconductor layer. The second control electrode faces the portion of the first semiconductor layer via the second insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
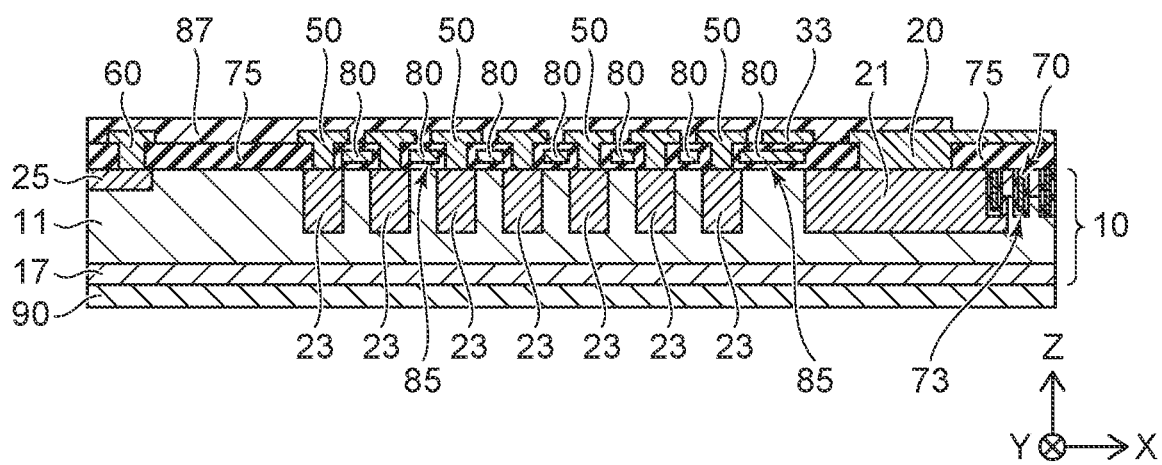

FIGS. 1A and 1B are schematic views showing a semiconductor device 1 according to an embodiment. FIG. 1A is a plan view showing a front surface of the semiconductor device 1. FIG. 1B is a cross-sectional view along line A-A shown in FIG. 1A. The semiconductor device 1 is, for example, an IGBT (Insulated Gate Bipolar Transistor).

As shown in FIGS. 1A and 1B, the semiconductor device 1 includes a semiconductor part 10, an emitter electrode 20 (a first electrode), a first control pad 30, a second control pad 40, a field plate 50, and an EQPR (Equivalent Potential Ring) electrode 60. For example, the emitter electrode 20, the first control pad 30, the second control pad 40, the field plate 50, and the EQPR electrode 60 are provided on the front surface of the semiconductor part 10 and are metal layers that include aluminum, etc.

The semiconductor part 10 includes, for example, an active region AR and a termination region TR. The termination region TR surrounds the active region AR in the front surface of the semiconductor part 10. The semiconductor part 10 is, for example, silicon.

The emitter electrode 20 is provided on the active region AR. The first control pad 30 is, for example, a gate pad. The first control pad 30 is apart from the emitter electrode 20 and is provided on, for example, the active region AR. A control interconnect 33 is linked to the first control pad 30. The control interconnect 33 is apart from the emitter electrode 20 and surrounds the emitter electrode 20.

For example, the second control pad 40 is provided on the termination region TR. The second control pad 40 is apart from the emitter electrode 20 and the first control pad 30. The field plate 50 is provided in the termination region TR.

The field plate 50 is apart from the first control pad 30, the control interconnect 33, and the second control pad 40. For example, the field plate 50 surrounds the active region AR outside the first control pad 30 and the control interconnect 33. In other words, the first control pad 30 and the control interconnect 33 are positioned between the field plate 50 and the active region AR. In the example, the second control pad 40 and the field plate 50 surround the active region AR.

The EQPR electrode 60 is provided outward of the second control pad 40 and the field plate 50. In other words, the second control pad 40 and the field plate 50 are positioned between the EQPR electrode 60 and the first control pad 30 and between the EQPR electrode 60 and the control interconnect 33. The EQPR electrode 60 is apart from the second control pad 40 and the field plate 50. The EQPR electrode 60 extends along the outer edge of the semiconductor part 10 and surrounds the second control pad 40 and the field plate 50.

As shown in FIG. 1B, the semiconductor device 1 further includes a first control electrode 70, a second control electrode 80, and a collector electrode 90.

The first control electrode 70 is provided in the active region AR. The first control electrode 70 is, for example, a gate electrode. For example, the first control electrode 70 is provided inside the semiconductor part 10 between the emitter electrode and the collector electrode 90. The first control electrode 70 is, for example, conductive polysilicon.

The first control electrode 70 is electrically insulated from the semiconductor part 10 by a first insulating film 73. The first insulating film 73 is, for example, a gate insulating film. The first control electrode 70 is electrically insulated from the emitter electrode 20 by an inter-layer insulating film 75. The first insulating film 73 and the inter-layer insulating film 75 are, for example, silicon oxide films.

The second control electrode 80 is provided on the termination region TR. The second control electrode 80 faces the front surface of the semiconductor part 10 via a second insulating film 85. The second control electrode 80 includes the same material as the first control electrode 70. The second control electrode 80 is, for example, conductive polysilicon. The second insulating film 85 is formed simultaneously with the first insulating film 73 and has substantially the same film thickness as a thickness of the first insulating film 73. The second insulating film 85 is, for example, a silicon oxide film.

The collector electrode 90 is provided on the back surface of the semiconductor part 10. The collector electrode 90 is, for example, a metal layer that includes nickel, etc.

The semiconductor part 10 includes, for example, an n-type base layer 11, a p-type collector layer 17, a first guard ring layer 21, a second guard ring layer 23, and an EQPR layer 25. In the following description, the first conductivity type is an n-type, and the second conductivity type is a p-type. The first guard ring layer 21 and the second guard ring layer 23 are, for example, p-type silicon layers. The EQPR layer 25 is, for example, an n-type silicon layer.

The n-type base layer 11 (a first semiconductor layer) extends between the emitter electrode 20 and the collector electrode 90. Moreover, the n-type base layer 11 extends from the active region AR to the termination region TR. The p-type collector layer 17 is provided between the n-type base layer 11 and the collector electrode 90. The collector electrode 90 is electrically connected to the p-type collector layer 17. For example, the collector electrode 90 is connected to the p-type collector layer 17 with an ohmic connection.

The first guard ring layer 21 (a fourth semiconductor layer) is provided on the n-type base layer 11 and surrounds the active region AR. For example, the first guard ring layer 21 is provided between the n-type base layer 11 and the emitter electrode 20 and is electrically connected to the emitter electrode 20.

The second guard ring layer 23 (another fourth semiconductor layer) is provided in the termination region TR. The second guard ring layer 23 is provided between the n-type base layer 11 and the field plate 50. The second guard ring layer 23 is electrically connected to the field plate 50. The second guard ring layer 23 surrounds the active region AR and the first guard ring layer 21 outward of the first guard ring layer 21. The second guard ring layer 23 is apart from the first guard ring layer 21.

The EQPR layer 25 is provided between the n-type base layer 11 and the EQPR electrode 60. The EQPR electrode 60 is electrically connected to the EQPR layer 25. The EQPR layer 25 includes an n-type impurity with a higher concentration than a concentration of an n-type impurity in the n-type base layer 11.

The second guard ring layer 23 is provided between the first guard ring layer 21 and the EQPR layer 25 at the front side of the semiconductor part 10. The n-type base layer 11 includes a portion extending between the first guard ring layer 21 and the second guard ring layer 23. The second control electrode 80 faces the portion of the n-type base layer 11 via the second insulating film 85.

The semiconductor device 1 includes multiple second guard ring layers 23 and multiple field plates 50. The multiple second guard ring layers 23 are electrically connected to the multiple field plates 50, respectively. The n-type base layer 11 includes another portion extending between adjacent second guard ring layers 23. The semiconductor device 1 further includes another second control electrode 80 that faces the other portion of the n-type base layer 11 via another second insulating film 85.

The semiconductor device 1 further includes a resin layer 87 that covers the termination region TR. The emitter electrode is exposed in an opening of the resin layer 87. The resin layer 87 is, for example, silicone.

Figure 2:
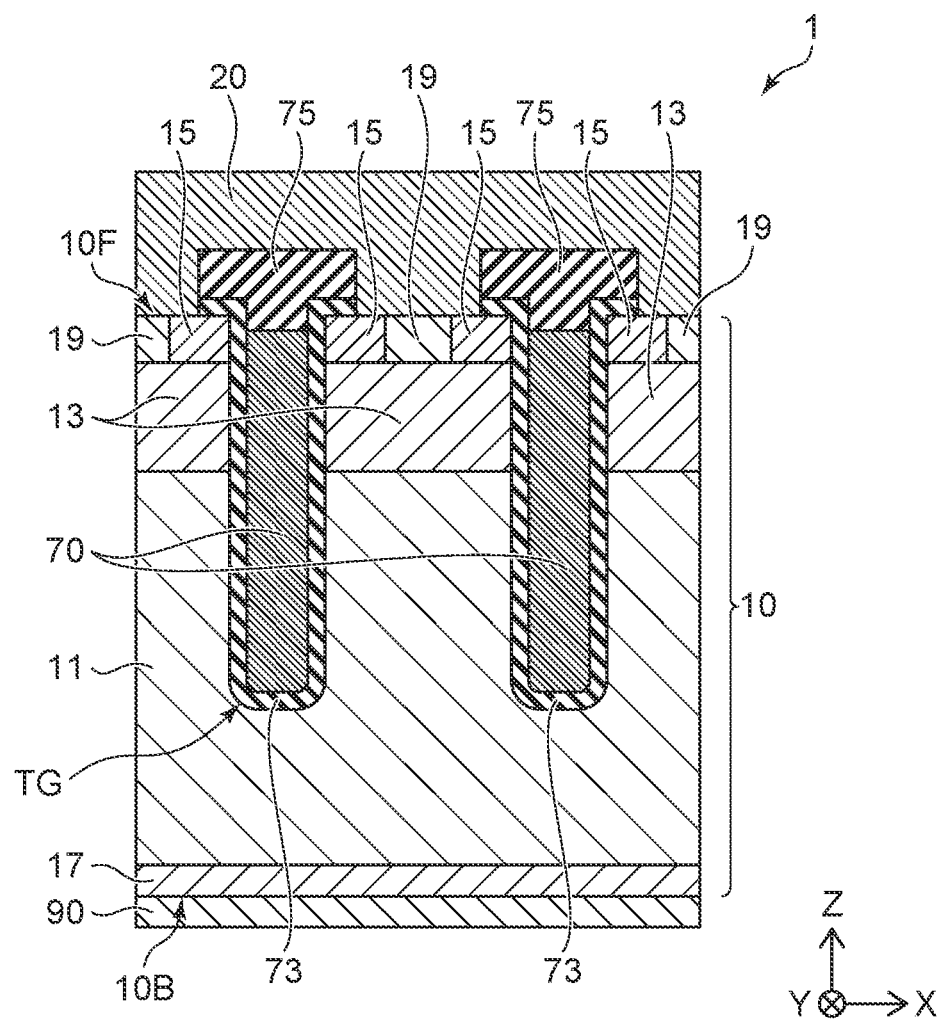
FIG. 2 is a schematic cross-sectional view showing the semiconductor device according to the embodiment.

FIG. 2 is a schematic cross-sectional view showing the semiconductor device 1 according to the embodiment. FIG. 2 is a schematic view illustrating a cross section of the active region AR of the semiconductor device 1.

As shown in FIG. 2, the emitter electrode 20 is provided on a front surface 10F of the semiconductor part 10. The collector electrode 90 is provided on a back surface 10B of the semiconductor part 10. The semiconductor part includes a trench TR provided at the front surface 10F side of the semiconductor part 10. The first control electrode 70 is provided inside the trench TG.

The first insulating film 73 is provided between the semiconductor part 10 and the first control electrode 70. For example, the first insulating film 73 is formed by thermal oxidation of the semiconductor part 10. The second insulating film 85 also is formed by the thermal oxidation of the semiconductor part 10 in the termination region TR. The second insulating film 85 is formed simultaneously with the first insulating film 73 and has substantially the same film thickness as a film thickness of the first insulating film 73. The film thicknesses of the first and second insulating films 73 and 85 are, for example, not more than 300 nanometers. In other words, the thicknesses of the first and second insulating films 73 and 85 are such that an inversion layer or an accumulation layer is induced respectively at an interface between the semiconductor part 10 and the first insulating film 73 and another interface between the semiconductor part 10 and the second insulating film 85.

The inter-layer insulating film 75 is provided between the emitter electrode 20 and the first control electrode 70. The first control electrode 70 is electrically insulated from the emitter electrode and is electrically connected to the first control pad via the control interconnect 33. The first control electrode 70 is electrically connected to the control interconnect 33, for example, via a contact hole provided in the inter-layer insulating film 75 (not-illustrated).

As shown in FIG. 2, the semiconductor part 10 further includes a p-type base layer 13, an n-type emitter layer 15, and a p-type emitter layer 19.

The p-type base layer 13 (a second semiconductor layer) is provided between the n-type base layer 11 and the emitter electrode 20. The p-type base layer 13 faces the first control electrode 70 via the first insulating film 73.

The n-type emitter layer 15 (a third semiconductor layer) is provided between the p-type base layer 13 and the emitter electrode 20. The n-type emitter layer 15 is partially provided on the p-type base layer 13. The n-type emitter layer 15 contacts the first insulating film 73. The n-type emitter layer 15 is in contact with the emitter electrode 20 and electrically connected thereto. The emitter electrode 20 is connected to the n-type emitter layer 15 with, for example, an ohmic connection. The p-type emitter layer 19 is partially provided between the p-type base layer 13 and the emitter electrode 20. The n-type emitter layer 15 and the p-type emitter layer 19 are arranged on the p-type base layer 13. The p-type emitter layer 19 includes a p-type impurity with a higher concentration than a concentration of the p-type impurity in the p-type base layer 13. The p-type emitter layer 19 is connected to the emitter electrode with, for example, an ohmic connection. The emitter electrode 20 is electrically connected to the p-type base layer 13 via the p-type emitter layer 19.

Figure 3A:
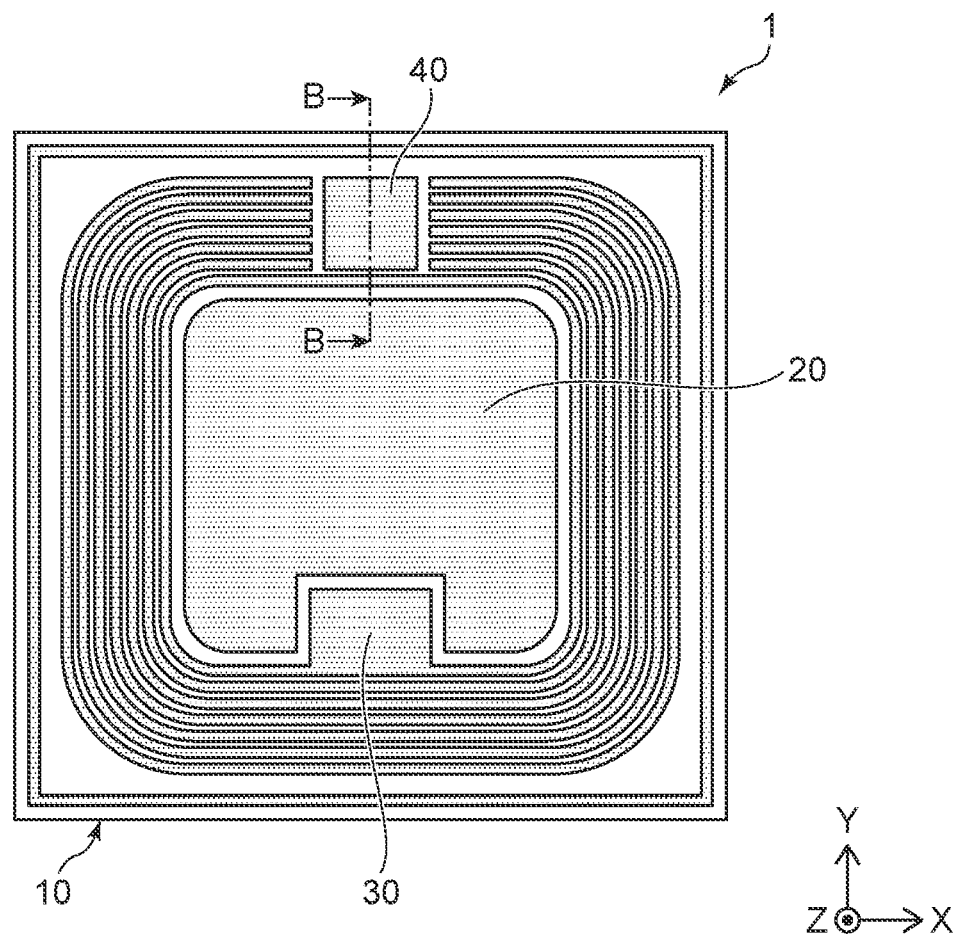
FIGS. 3A and 3B are other schematic cross-sectional views showing the semiconductor device according to the embodiment.
Figure 3B:
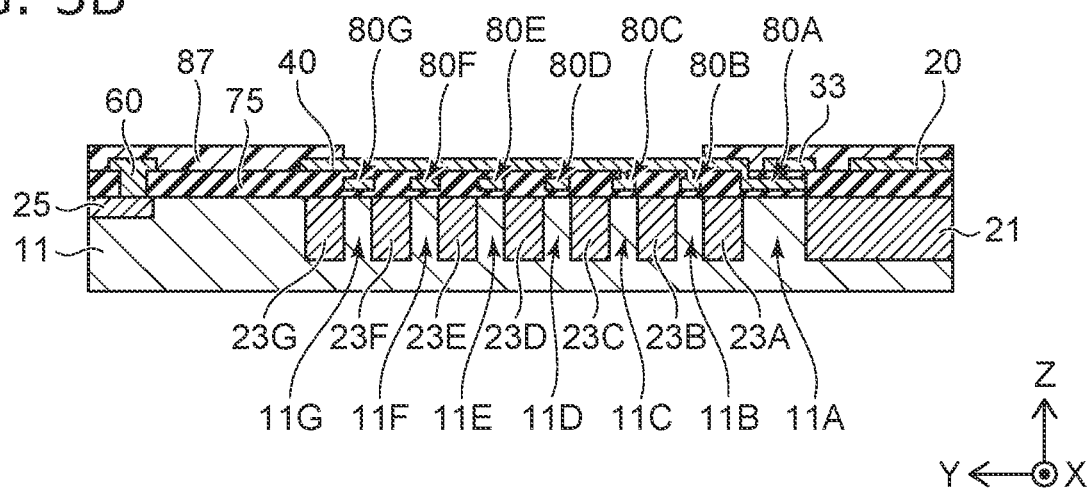

FIGS. 3A and 3B are other schematic cross-sectional views showing the semiconductor device 1 according to the embodiment. FIG. 3A is a plan view illustrating the front side of the semiconductor part 10. FIG. 3B is a cross-sectional view along line B-B shown in FIG. 3A.

As shown in FIG. 3B, the semiconductor device 1 includes multiple second control electrodes 80A to 80G. The semiconductor part 10 includes multiple second guard ring layers 23A to 23G. The second guard ring layers 23A to 23G are arranged in this order in the direction from the first guard ring layer 21 toward the EQPR layer 25. The second control electrodes 80A to 80G each face a portion of the n-type base layer 11 via the second insulating film 85.

A second control electrode 80A faces a first portion 11A of the n-type base layer 11. The first portion 11A of the n-type base layer 11 is positioned between the first guard ring layer 21 and a second guard ring layer 23A.

A second control electrode 80B faces a second portion 11B of the n-type base layer 11. The second portion 11B of the n-type base layer 11 is positioned between the second guard ring layer 23A and a second second-guard ring layer 23B.

A second control electrode 80C faces a third portion 11C of the n-type base layer 11. The third portion 11C of the n-type base layer 11 is positioned between the second second-guard ring layer 23B and a third second-guard ring layer 23C.

A second control electrode 80D faces a fourth portion 11D of the n-type base layer 11. The fourth portion 11D of the n-type base layer 11 is positioned between the third second-guard ring layer 23C and a fourth second-guard ring layer 23D.

A second control electrode 80E faces a fifth portion 11E of the n-type base layer 11. The fifth portion 11E of the n-type base layer 11 is positioned between the fourth second-guard ring layer 23D and a fifth second-guard ring layer 23E.

A second control electrode 80F faces a sixth portion 11F of the n-type base layer 11. The sixth portion 11F of the n-type base layer 11 is positioned between the fifth second-guard ring layer 23E and a sixth second-guard ring layer 23F.

A second control electrode 80G faces a seventh portion 11G of the n-type base layer 11. The seventh portion 11G of the n-type base layer 11 is positioned between the sixth second-guard ring layer 23F and a seventh second-guard ring layer 23G.

In the example, the second control electrodes 80A, 80B, and 80C are electrically connected to the second control pad 40 via contact holes provided in the inter-layer insulating film 75. In other words, the semiconductor device 1 is configured so that the potentials of the second control electrodes 80A, 80B, and 80C can be controlled via the second control pad 40. On the other hand, the second control electrodes 80D, 80E, 80F, and 80G each have a floating potential when operating the semiconductor device 1.

Figure 4A:
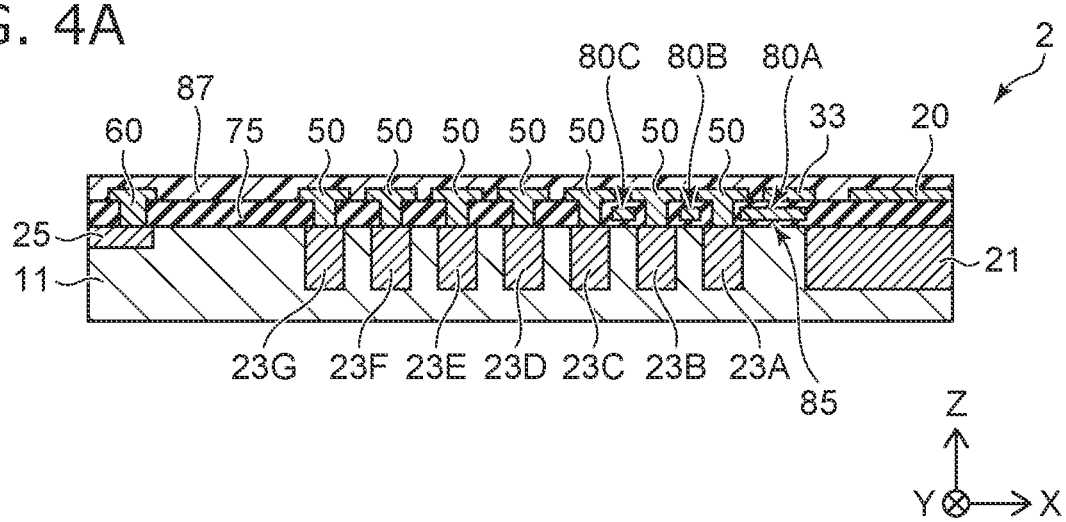
FIGS. 4A to 4C are schematic cross-sectional views showing semiconductor devices according to a first modification of the embodiment.
Figure 4B:
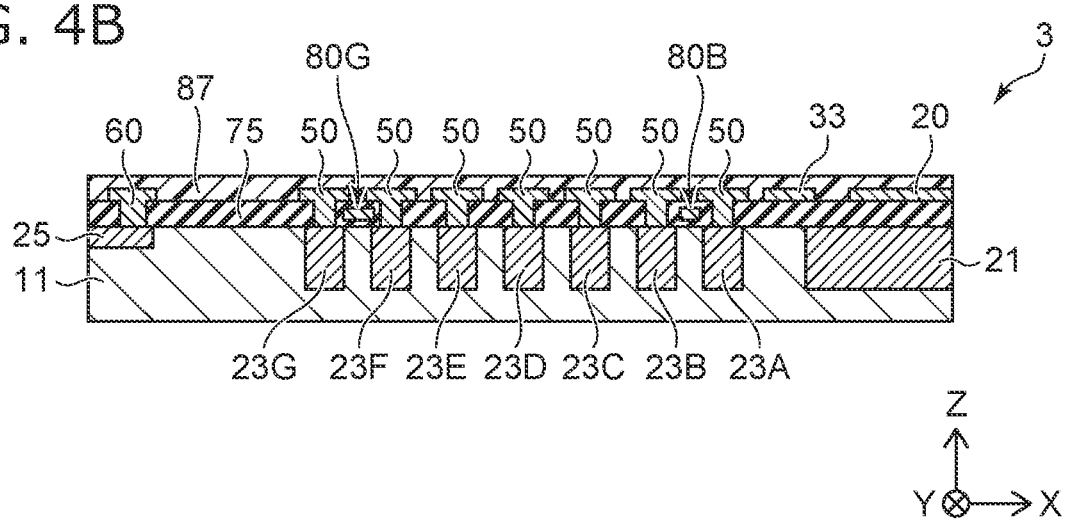
Figure 4C:
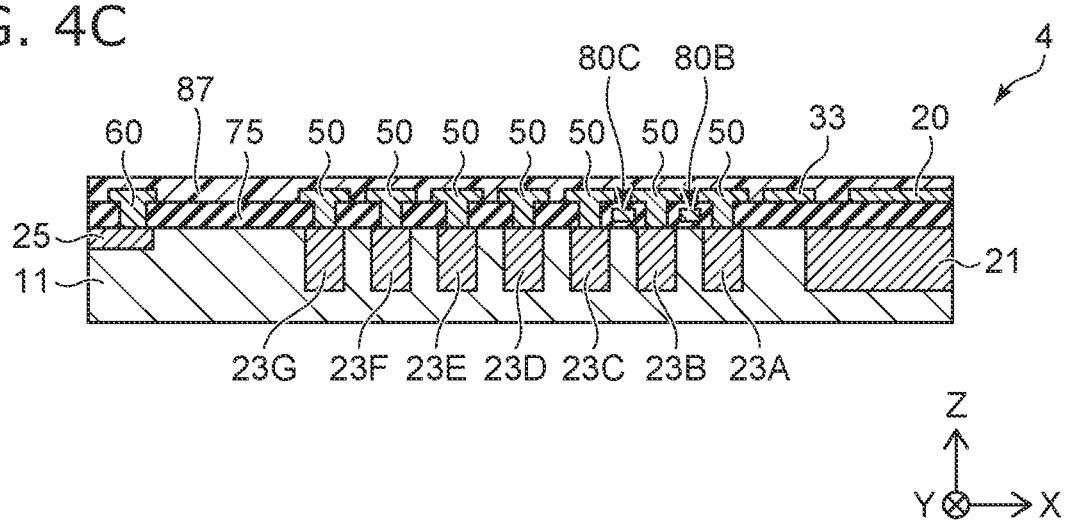

FIGS. 4A to 4C are schematic cross-sectional views showing semiconductor devices 2, 3, and 4 according to a first modification of the embodiment. FIGS. 4A to 4C are cross-sectional views along line A-A shown in FIG. 1A.

As shown in FIG. 4A, the semiconductor device 2 includes the second control electrodes 80A, 80B, and 80C. The semiconductor device 2 does not include the second control electrodes 80D, 80E, 80F, and 80G (see FIG. 1B).

As shown in FIG. 4B, the semiconductor device 3 includes the second control electrodes 80B and 80G. The semiconductor device 3 does not include the second control electrodes 80A, 80C, 80D, 80E, and 80F (see FIG. 1B).

As shown in FIG. 4C, the semiconductor device 4 includes the second control electrodes 80B and 80C. The semiconductor device 4 does not include the second control electrodes 80A, 80D, 80E, 80F, and 80G (see FIG. 1B).

The arrangement of the second control electrodes 80A to 80G is not limited to the examples described above, and it is sufficient in the arrangement to include at least one of the second control electrodes 80A to 80G.

Figure 5A:
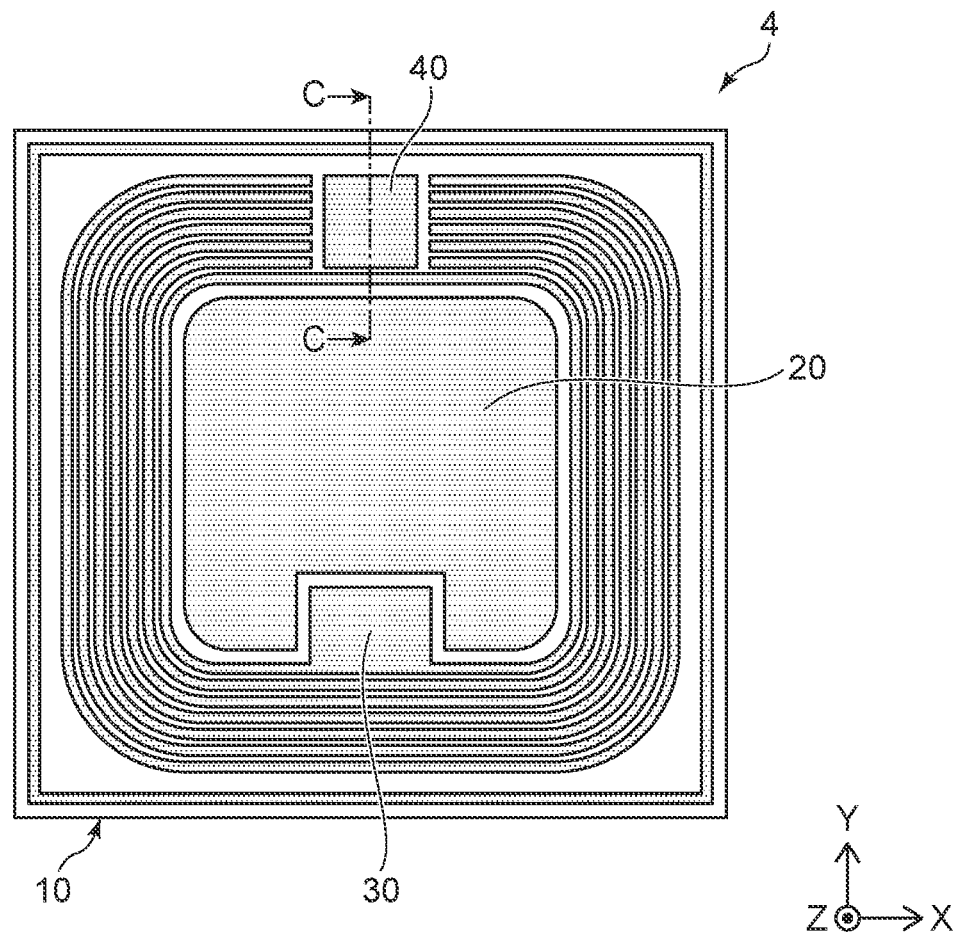
FIGS. 5A and 5B are schematic views showing the semiconductor device according to the first modification of the embodiment.
Figure 5B:
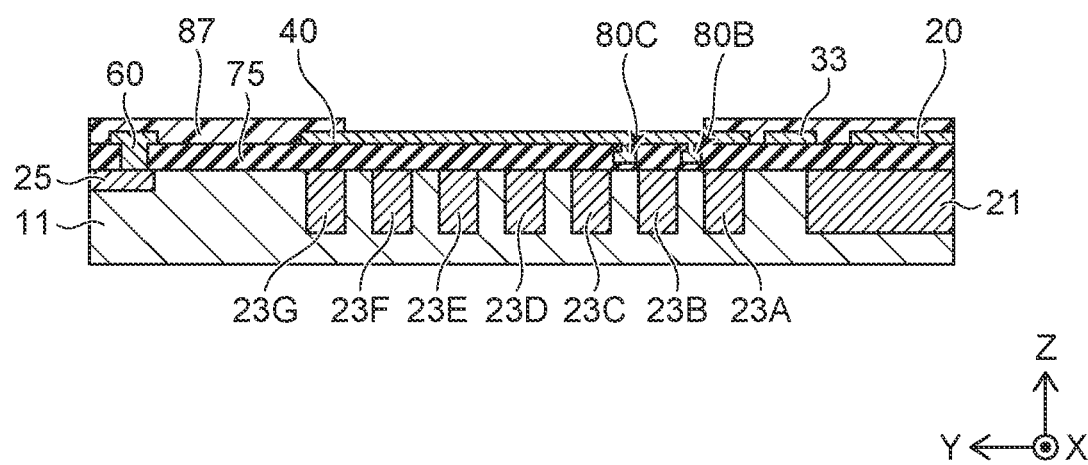

FIGS. 5A and 5B are schematic views showing the semiconductor device 4 according to the first modification of the embodiment. FIG. 5A is a plan view illustrating the front side of the semiconductor part 10. FIG. 5B is a cross-sectional view along line C-C shown in FIG. 5A.

As shown in FIG. 5B, the second control electrodes 80B and 80C are electrically connected to the second control pad 40 via contact holes provided in the inter-layer insulating film 75. In other words, the semiconductor device 4 is configured so that the potentials of the second control electrodes 80B and 80C can be controlled via the second control pad 40.

Figure 6A:
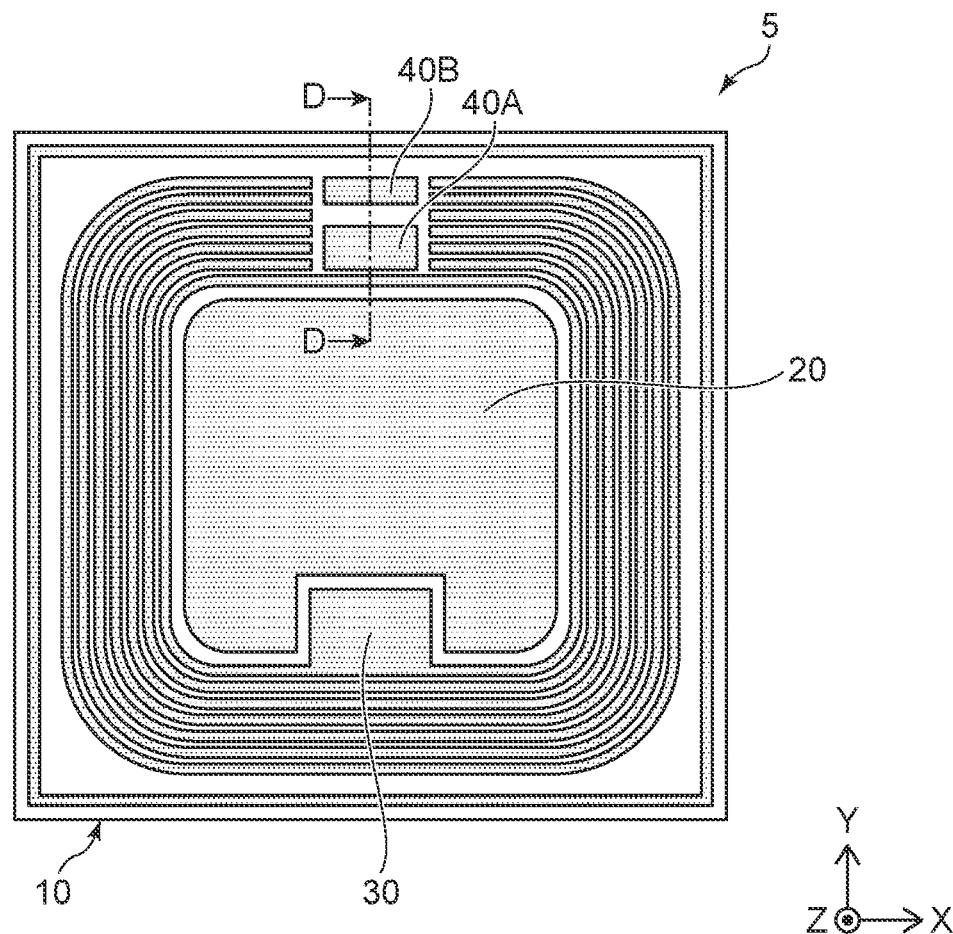
FIGS. 6A and 6B are schematic views showing a semiconductor device according to a second modification of the embodiment.
Figure 6B:
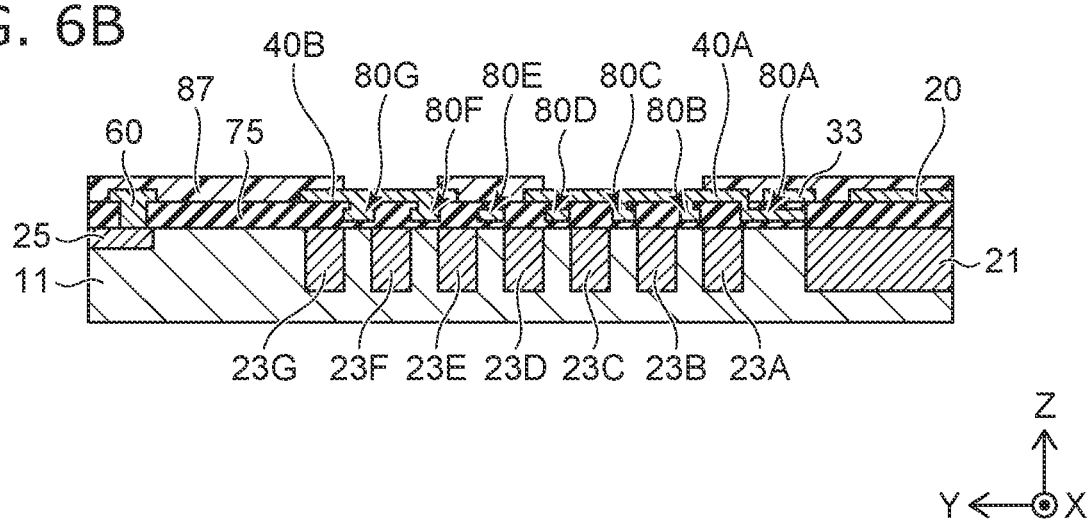

FIGS. 6A and 6B are schematic views showing a semiconductor device 5 according to a second modification of the embodiment. FIG. 6A is a plan view illustrating the front side of the semiconductor part 10. FIG. 6B is a cross-sectional view along line D-D shown in FIG. 6A.

As shown in FIG. 6A, the semiconductor device 5 includes a first second-control pad 40A and a second second-control pad 40B. The second control pads 40A and 40B are arranged on the termination region TR and are apart from each other. The second control pads 40A and 40B are provided on an inter-layer insulating film 47 and are electrically insulated from the semiconductor part 10.

As shown in FIG. 6B, the semiconductor device 5 includes the second control electrodes 80A to 80G. The second control electrodes 80A, 80B, 80C, and 80D are electrically connected to the second control pad 40A. The second control electrodes 80F and 80G are electrically connected to the second control pad 40B.

In the semiconductor device 5, the potentials of the second control electrodes 80A, 80B, 80C, and 80D are controlled via the second control pad 40A. The potentials of the second control electrodes 80F and 80G are controlled via the second control pad 40B. In the example, the potentials of the second control electrodes 80F and 80G can be controlled independently from the potentials of the second control electrodes 80A, 80B, 80C, and 80D.

On the other hand, the second control electrode 80E has a floating potential when operating the semiconductor device 5. In other words, the potential of the second control electrode 80E is changed depending on the potentials of the n-type base layer 11, the second guard ring layers 23D and 23E, the second control electrode 80D, and the second control electrode 80F.

Figure 7A:
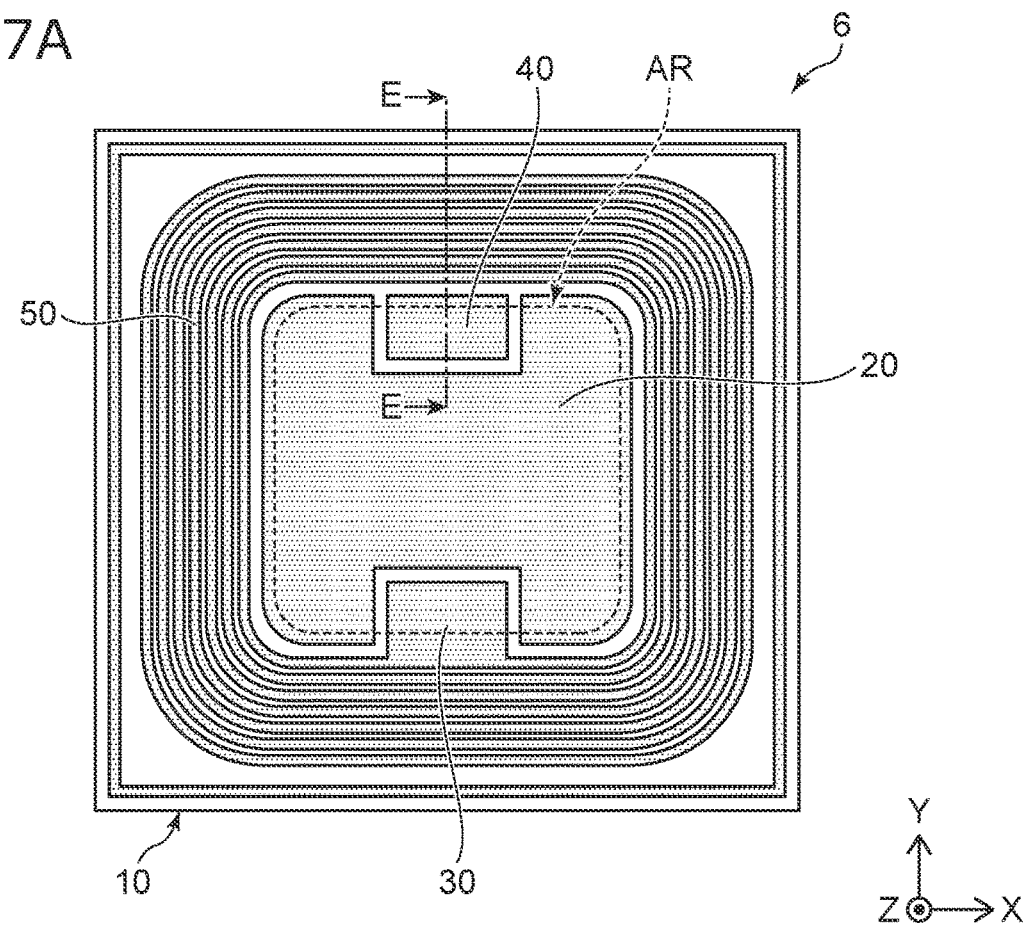
FIGS. 7A and 7B are schematic views showing a semiconductor device according to a third modification of the embodiment.
Figure 7B:
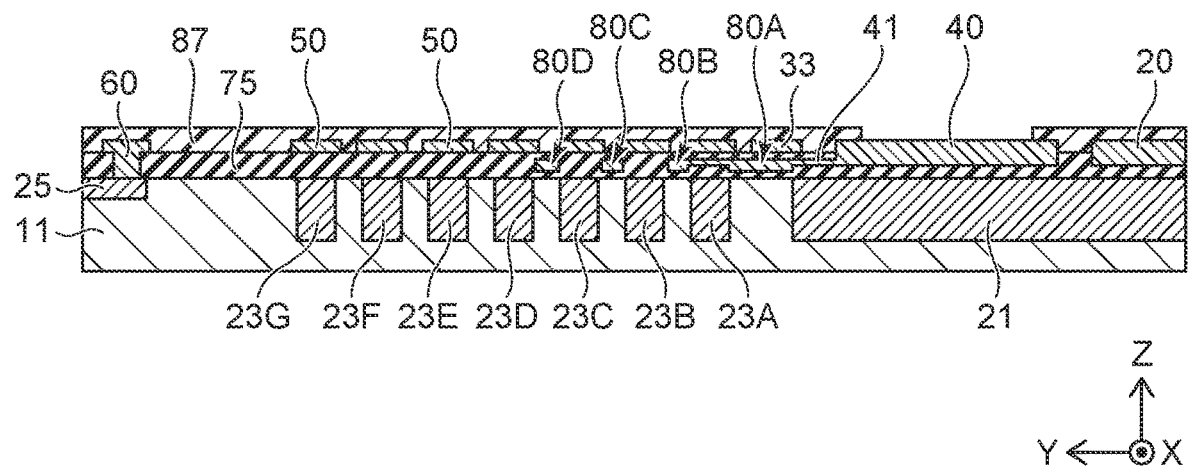

FIGS. 7A and 7B are schematic views showing a semiconductor device 6 according to a third modification of the embodiment. FIG. 7A is a plan view illustrating the front side of the semiconductor part 10. FIG. 7B is a cross-sectional view along line E-E shown in FIG. 7A.

As shown in FIG. 7A, the second control pad 40 is provided inside the active region AR. Therefore, the field plate 50 surrounds the active region AR without breaks.

As shown in FIG. 7B, the semiconductor device 6 includes the second control electrodes 80A to 80D. The second control electrodes 80E to 80G are not included in the example. The second control electrodes 80A and 80B are electrically connected to the second control pad 40 via a control interconnect 41. The control interconnect 41 is provided inside the inter-layer insulating film 75.

In the semiconductor device 6, the potentials of the second control electrodes 80A and 80B are controlled via the second control pad 40. The second control electrodes 80C and 80D each have a floating potential when operating the semiconductor device 6.

Figure 8A:
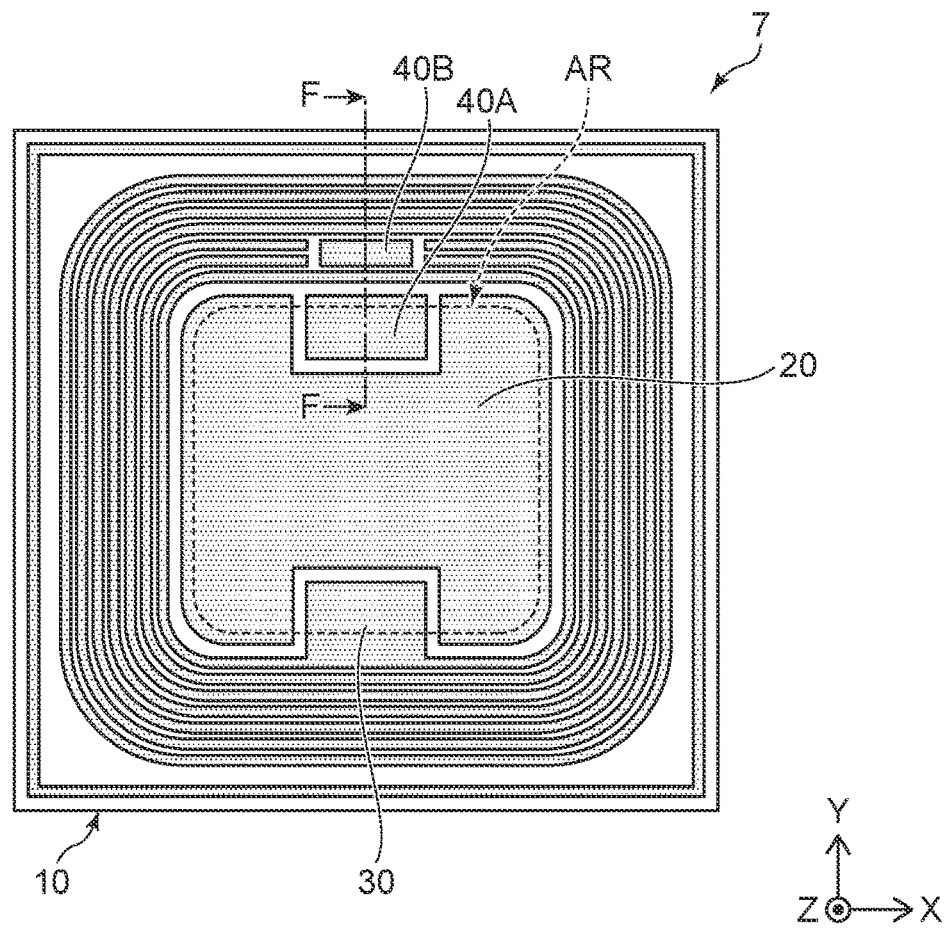
FIGS. 8A and 8B are schematic views showing a semiconductor device according to a fourth modification of the embodiment.
Figure 8B:
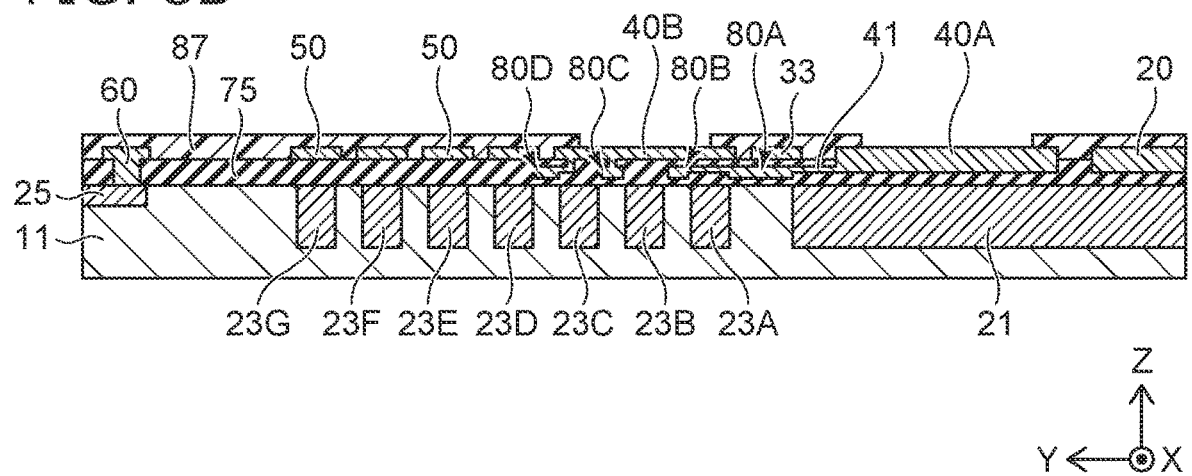

FIGS. 8A and 8B are schematic views showing a semiconductor device 7 according to a fourth modification of the embodiment. FIG. 8A is a plan view illustrating the front side of the semiconductor part 10. FIG. 8B is a cross-sectional view along line F-F shown in FIG. 8A.

As shown in FIG. 8A, the semiconductor device 7 includes the second control pads 40A and 40B. The second control pad 40A is provided on the active region AR. The second control pad 40B is provided on the termination region TR.

As shown in FIG. 8B, the semiconductor device 7 includes the second control electrodes 80A to 80D. The second control electrodes 80E to 80G are not included in the example. The second control electrodes 80A and 80B are electrically connected to the second control pad 40A via the control interconnect 41. The second control electrodes 80C and 80D are electrically connected to the second control pad 40B via contact holes provided in the inter-layer insulating film 75.

In the semiconductor device 7, the potentials of the second control electrodes 80A and 80B are controlled via the second control pad 40A. The potentials of the second control electrodes 80C and 80D are controlled via the second control pad 40B. Also, in the example, the potentials of the second control electrodes 80C and 80D can be controlled independently from the potentials of the second control electrodes 80A and 80B.

Figure 9A:
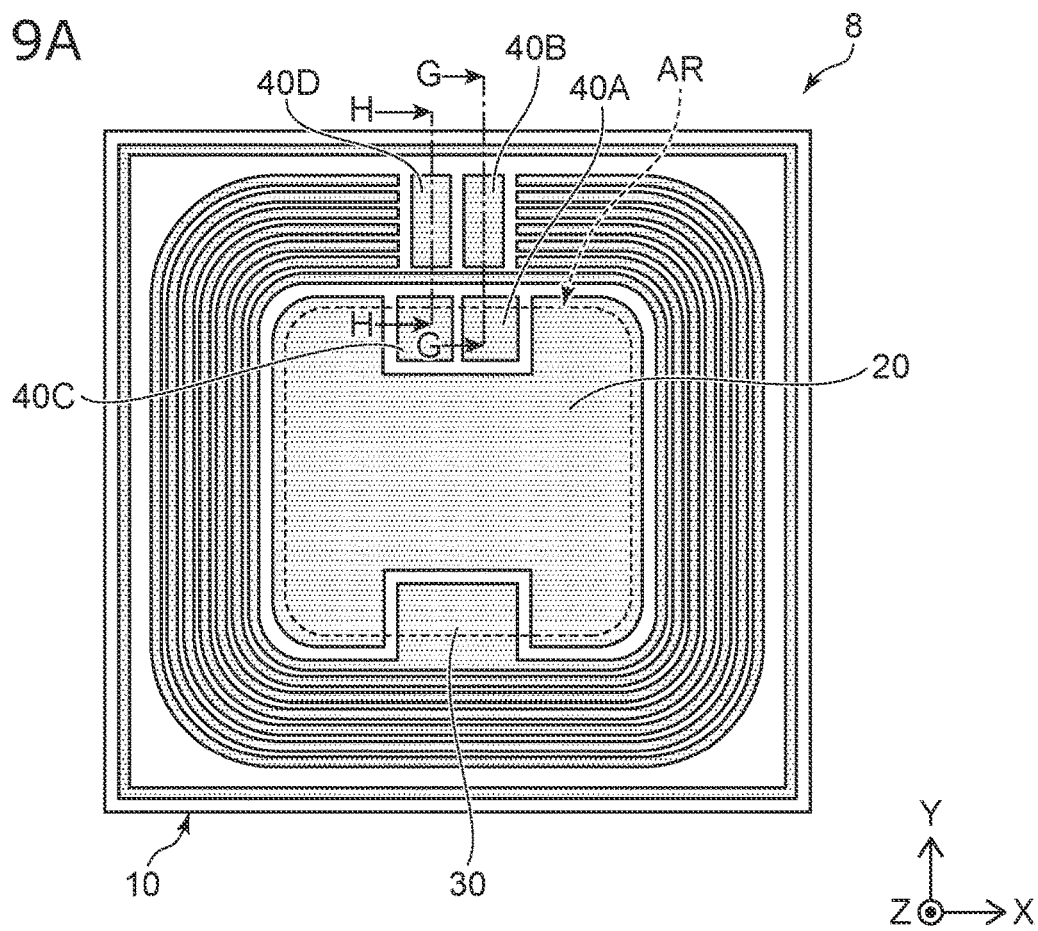
FIGS. 9A to 9C are schematic views showing a semiconductor device according to a fifth modification of the embodiment.
Figure 9B:
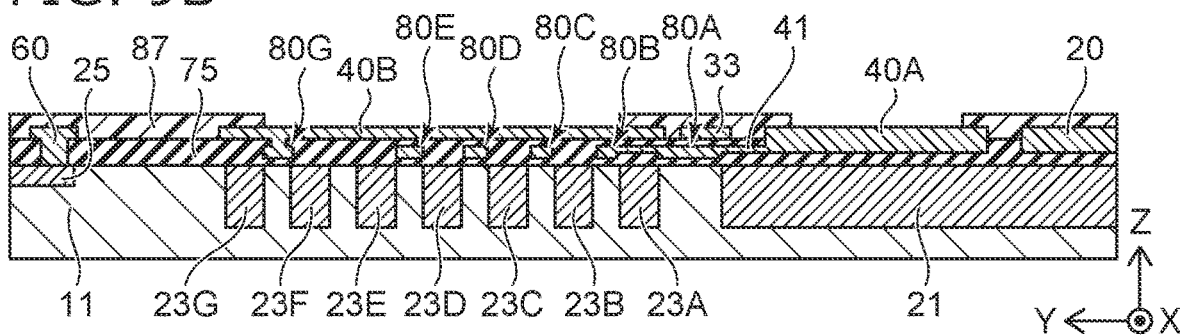
Figure 9C:
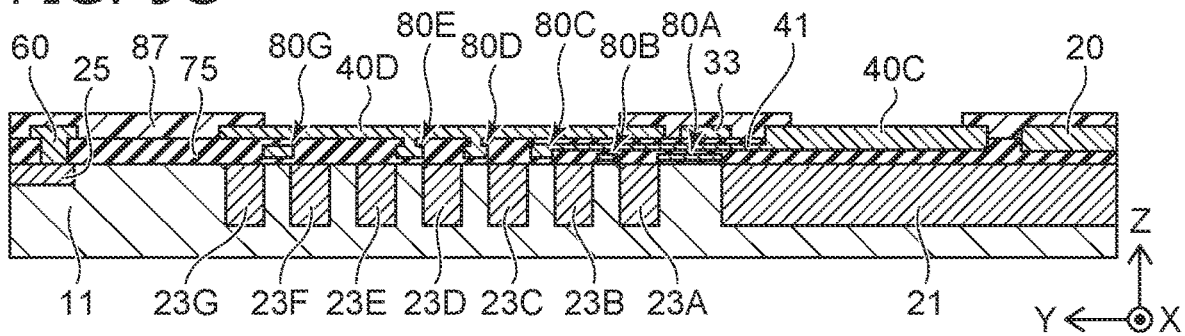

FIGS. 9A to 9C are schematic views showing a semiconductor device 8 according to a fifth modification of the embodiment. FIG. 9A is a plan view illustrating the front side of the semiconductor part 10. FIG. 9B is a cross-sectional view along line G-G shown in FIG. 9A. FIG. 9C is a cross-sectional view along line H-H shown in FIG. 9A.

As shown in FIG. 9A, the semiconductor device 8 includes the second control pads 40A to 40D. The second control pads 40A and 40C are provided on the active region AR. The second control pad 40C is apart from the second control pad 40A. The second control pads 40B and 40D are provided on the termination region TR. The second control pad 40B is apart from the second control pad 40D.

As shown in FIGS. 9B and 9C, the second control pads 40A to 40D are electrically insulated from the semiconductor part 10 by the inter-layer insulating film 75. The semiconductor device 8 includes the second control electrodes 80A to 80E and 80G. The second control electrode 80F is not included in the example.

As shown in FIG. 9B, the second control electrodes 80A and 80B are electrically connected to the second control pad 40A via the control interconnect 41. The second control electrode 80G is electrically connected to the second control pad 40B via a contact hole provided in the inter-layer insulating film 75.

As shown in FIG. 9C, the second control electrode 80C is electrically connected to the second control pad 40C via a control interconnect 43. The second control electrodes 80D and 80E are electrically connected to the second control pad 40B via contact holes provided in the inter-layer insulating film 75.

In the semiconductor device 8, the potentials of the second control electrodes 80A and 80B are controlled via the second control pad 40A. The potential of the second control electrode 80C is controlled via the second control pad 40C.

The potentials of the second control electrodes 80D and 80E are controlled via the second control pad 40D; and the potential of the second control electrode 80G is controlled via the second control pad 40B.

Also, in the example, the potentials of the second control electrodes 80A and 80B can be controlled independently from the potentials of the second control electrodes 80C, 80D, 80E, and 80G. The potential of the second control electrode 80C can be controlled independently from the potentials of the second control electrodes 80A, 80B, 80D, 80E, and 80G. The potentials of the second control electrodes 80D and 80E can be controlled independently from the potentials of the second control electrodes 80A, 80B, 80C, and 80G. The potential of the second control electrode 80G can be controlled independently from the potentials of the second control electrodes 80A to 80E.

Figure 10A:
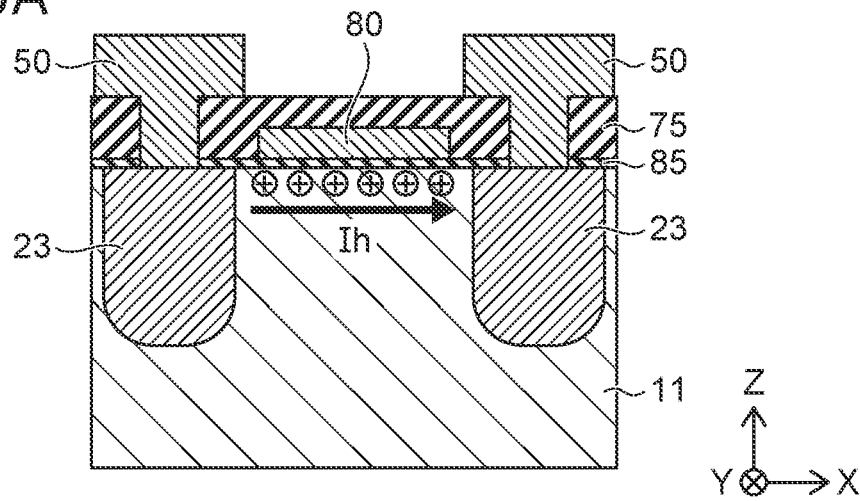
FIGS. 10A to 10C are schematic views showing operations of the semiconductor device according to the embodiment.
Figure 10B:
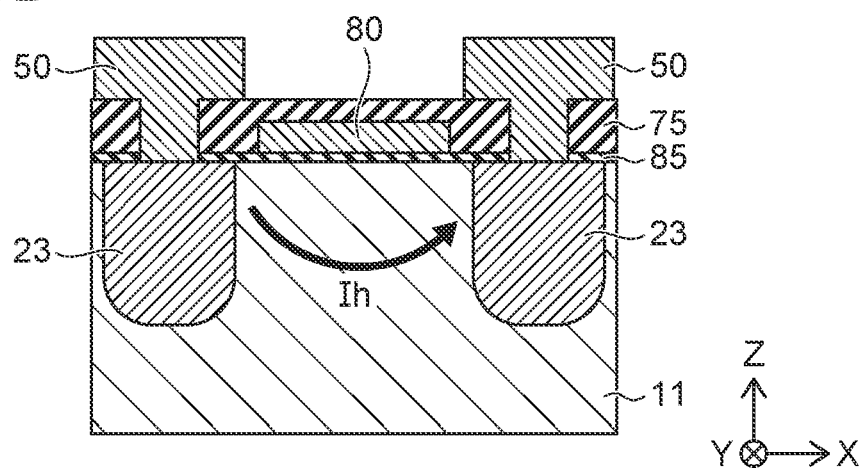
Figure 10C:
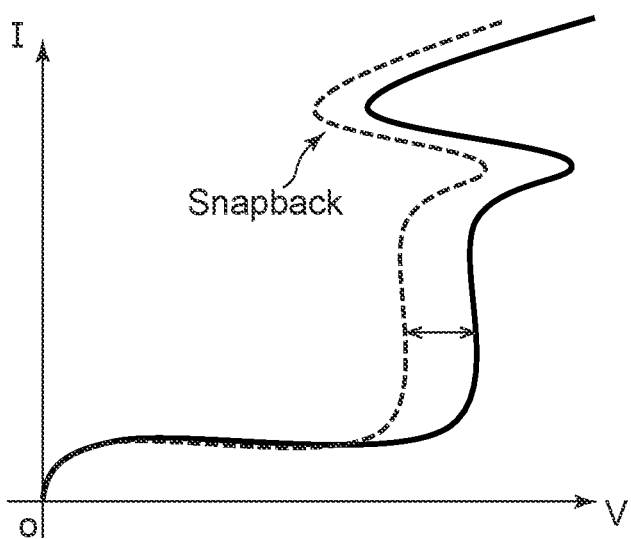

FIGS. 10A to 10C are schematic views showing operations of the semiconductor device 1 according to the embodiment. FIGS. 10A and 10B are partial cross-sectional views of the termination region TR. FIG. 10C is a graph showing a voltage-current characteristic in the termination region TR. The horizontal axis is the voltage; and the vertical axis is the current.

As shown in FIG. 10A, the potential of the second control electrode 80 has a negative potential with respect to the n-type base layer 11; and a p-type inversion layer is induced at the interface between the n-type base layer 11 and the second insulating film 85. Therefore, a hole current Ih flows through the p-type inversion layer.

On the other hand, as shown in FIG. 10B, when the potential of the second control electrode 80 has a positive potential with respect to the n-type base layer 11, a depression region is formed at the interface between the n-type base layer 11 and the second insulating film 85; and the hole current Ih flows through a region that is apart from the interface between the n-type base layer 11 and the second insulating film 85.

Thus, the path of the hole current Ih flowing through the termination region TR can be changed by controlling the potential of the second control electrode 80. Thereby, it is possible to suppress, for example, impact ionization inside the n-type base layer 11.

As shown in FIG. 10C, the voltage-current characteristic in the termination region TR can be changed by controlling the potential of the second control electrode 80. In other words, the avalanche breakdown voltage is increased by suppressing the impact ionization in the termination region TR. The snapback characteristic can be improved thereby, and the breakdown immunity can be increased.

Figure 11:
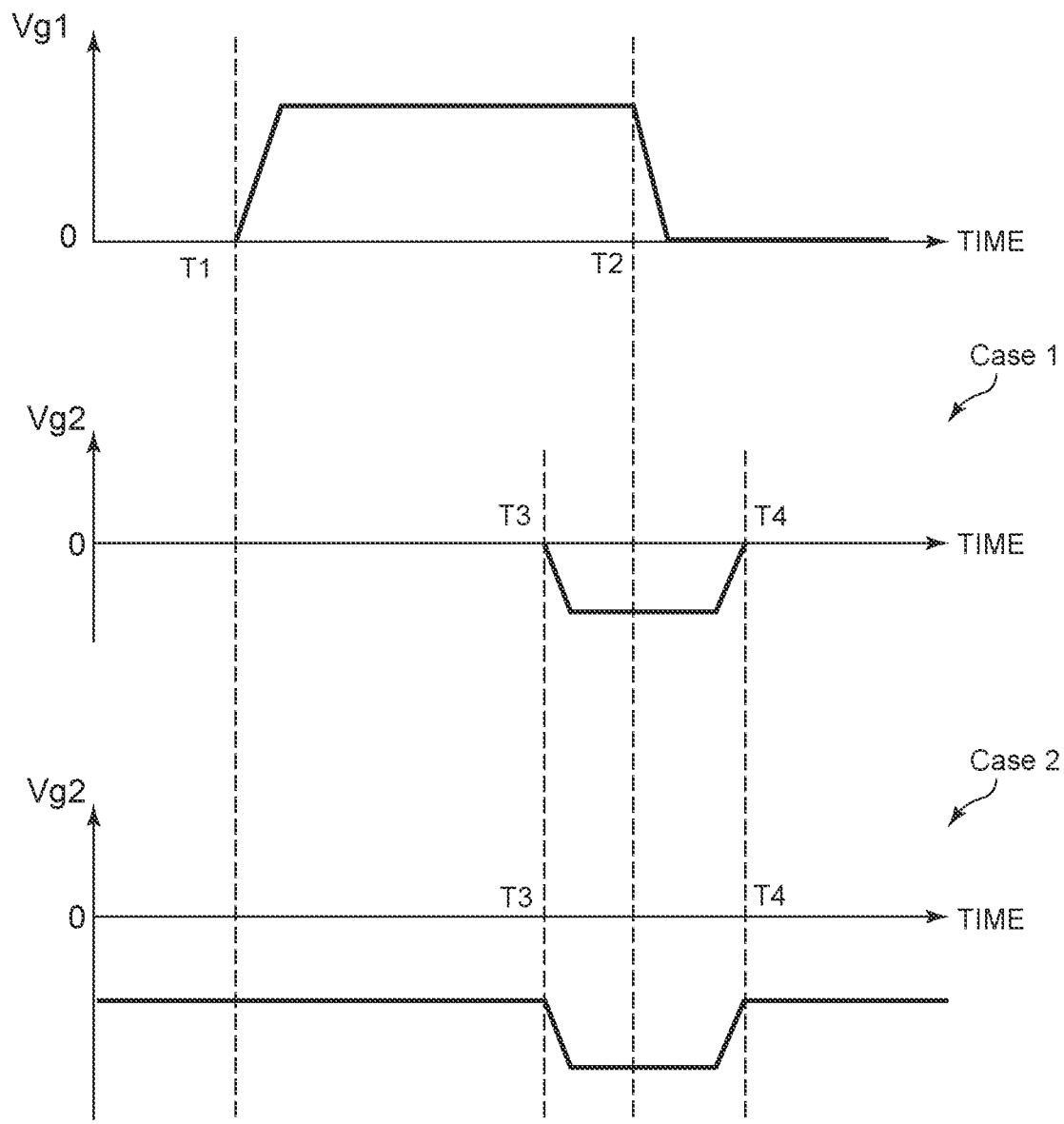
FIG. 11 is a schematic view showing a method for controlling the semiconductor device according to the embodiment.

FIG. 11 is a schematic view showing a method for controlling the semiconductor device 1 according to the embodiment. FIG. 11 is a time chart showing a gate voltage Vg1 applied to the first control electrode 70 and a gate voltage Vg2 applied to the second control electrode 80.

For example, at a time T1, the gate voltage Vg1 (a positive voltage) greater than a threshold voltage of the first control electrode 70 is applied thereto; and the semiconductor device 1 transitions from the off-state to the on-state (i.e., is turned on). At a time T2, the gate voltage Vg1 is lowered to a voltage, e.g., 0 V that is less than the threshold voltage of the first control electrode 70; and the semiconductor device 1 transitions from the on-state to the off-state (i.e., is turned off).

On the other hand, the gate voltage Vg2 that is applied to the second control electrode 80 is maintained at, for example, 0 V until a time T3 that is after the time T1 and before the time T2 (Case 1). At the time T3, the gate voltage Vg2 is lowered to a negative voltage. Subsequently, the gate voltage Vg2 is returned to, for example, 0 V at a time T4 after the time T2.

According to such a gate control in the turn-off process of the semiconductor device 1, a p-type inversion layer is induced at the interface between the n-type base layer 11 and the second insulating film 85. The impact ionization in the termination region TR can be suppressed thereby, and the semiconductor device 1 can have the increased breakdown immunity.

In another control method (Case 2), the gate voltage Vg2 may be maintained at a negative voltage; and the gate voltage Vg2 may be further lowered to a low voltage at the time T3. Thereby, it may be possible to further improve the breakdown immunity of the semiconductor device 1.

FIGS. 12A to 12E are other schematic views showing the method for controlling the semiconductor device according to the embodiment. FIGS. 12A to 12E illustrate the examples of methods for controlling the second control electrodes 80A to 80Z. The second control electrodes 80A to 80C, 80P to 80R, and 80X to 80Z are shown in these drawings. At least one second control electrode 80 is provided between the second control electrode 80C and the second control electrode 80P. At least one second control electrode 80 is provided between a second control electrode 80R and a second control electrode 80X.

Figure 12A:
FIGS. 12A to 12E are other schematic views showing the method for controlling the semiconductor device according to the embodiment.

As shown in FIG. 12A, a negative potential is applied to the second control electrode 80B; and the other second control electrodes 80A and 80C to 80Z are biased to positive potentials or set to floating potentials.

Figure 12B:

As shown in FIG. 12B, a negative potential is applied to the second control electrode 80Q; and the other second control electrodes 80A to 80P and 80R to 80Z are biased to positive potentials or set to floating potentials.

Figure 12C:

As shown in FIG. 12C, a negative potential is applied to the second control electrode 80Q; and the other second control electrodes 80A to 80P and 80R to 80Z are set to a floating potential FL.

Figure 12D:
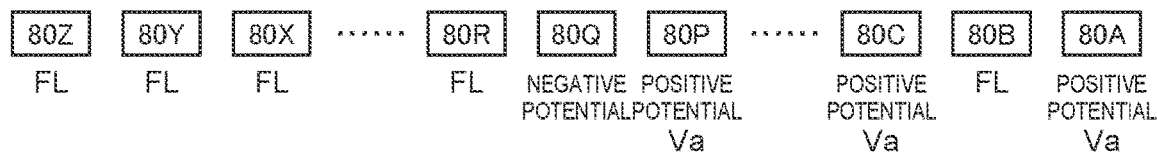

As shown in FIG. 12D, a negative potential is applied to the second control electrode 80Q; and a positive potential Va is applied to the second control electrodes 80A and 80C to 80P. The second control electrodes 80R to 80Z are set to the floating potential FL.

Figure 12E:
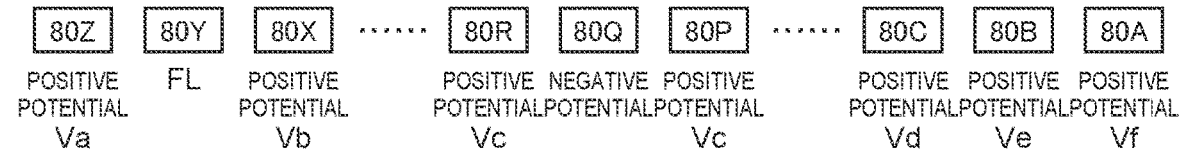

As shown in FIG. 12E, a negative potential is applied to the second control electrode 80Q; and positive potentials Vd to Vf different from each other are applied to the second control electrodes 80A to 80C, respectively. A positive potential Vc is applied to the second control electrodes 80R and 80P. The different positive potentials Va and Vb are applied to the second control electrodes 80X and 80Z; and the second control electrode 80Y is set to the floating potential FL.

Thus, in the semiconductor device 1, the avalanche breakdown voltage and the snapback characteristic of the termination region TR can be controlled by changing the potentials applied to the multiple second control electrodes 80. For example, the impact ionization easily occurs at the vicinity of the second control electrodes 80 that is biased to a negative potential. The impact ionization is suppressed under the other second control electrodes 80. In other words, the avalanche breakdown can be appropriately controlled in the termination region TR.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including an active region and a termination region, the termination region surrounding the active region in a front surface of the semiconductor part;
a first electrode provided on the front surface of the semiconductor part in the active region;
a first control electrode provided in the active region, the first control electrode facing the semiconductor part via a first insulating film;
a plurality of second control electrodes provided on the termination region with a second insulating film interposed, the plurality of second control electrodes including a first second-control electrode and a second second-control electrode;
a first control pad provided on the front surface of the semiconductor part, the first control pad being apart from the first electrode, the first control pad being electrically connected to the first control electrode; and
a second control pad provided on the front surface of the semiconductor part, the second control pad being apart from the first electrode and the first control pad, the second control pad being electrically connected to the plurality of second control electrodes,
the semiconductor part including a first semiconductor layer of a first conductivity type, a second semiconductor layer of a second conductivity type, a third semiconductor layer of the first conductivity type and a plurality of fourth semiconductor layers of the second conductivity type,
the first semiconductor layer being provided in the active region and extending into the termination region,
the second semiconductor layer being provided between the first semiconductor layer and the first electrode in the active region, the second semiconductor layer facing the first control electrode via the first insulating film,
the third semiconductor layer being provided between the second semiconductor layer and the first electrode, the third semiconductor layer being partially provided on the second semiconductor layer and electrically connected to the first electrode, and
the plurality of fourth semiconductor layers being provided on the first semiconductor layer in the termination region, the plurality of fourth semiconductor layers being apart from each other, the plurality of fourth semiconductor layers surrounding the active region in the front surface of the semiconductor part, the plurality of fourth semiconductor layers including a first fourth-semiconductor layer, a second fourth-semiconductor layer, a third fourth-semiconductor layer, the second fourth-semiconductor layer being adjacent to the first fourth-semiconductor layer, the second fourth-semiconductor layer surrounding the second semiconductor layer and the first fourth-semiconductor layer, the third fourth-semiconductor layer surrounding the second fourth-semiconductor layer,
the first semiconductor layer including a first portion extending between the first fourth-semiconductor layer and the second fourth-semiconductor layer, the first second-control electrode facing the first portion of the first semiconductor layer via the second insulating film in a direction perpendicular to the front surface,
the first semiconductor layer including a second portion extending between the second fourth-semiconductor layer and the third fourth-semiconductor layer, the second second-control electrode facing the second portion of the first semiconductor layer via the second insulating film in the direction perpendicular to the front surface.

2. The device according to claim 1, wherein
the second second-control electrode is electrically connected to the second control pad.

3. The device according to claim 1, further comprising:
a third control pad provided on the front surface of the semiconductor part, the third control pad being apart from the first electrode, the first control pad, and the second control pad,
the second second-control electrode being electrically connected to the third control pad.

4. The device according to claim 1, wherein
the plurality of fourth semiconductor layers includes an innermost fourth semiconductor layer most proximate to the second semiconductor layer, and
the innermost fourth semiconductor layer is linked to the second semiconductor layer.

5. The device according to claim 1, wherein
the first fourth-semiconductor layer is provided at a position most proximate to the second semiconductor layer.

6. The device according to claim 4, wherein
the first fourth-semiconductor layer is provided at a position adjacent to the innermost fourth semiconductor layer.

7. The device according to claim 1,
wherein
the plurality of second control electrodes includes a third second-control electrode,
the plurality of fourth semiconductor layers includes a fourth fourth-semiconductor layer, the fourth fourth-semiconductor layer being adjacent to the third fourth-semiconductor layer, the fourth fourth-semiconductor layer being provided at an outermost position of the plurality of fourth semiconductor layers,
the first semiconductor layer includes a third portion extending between the third fourth-semiconductor layer and the fourth fourth-semiconductor layer,
the third second-control electrode faces the third portion of the first semiconductor layer via the second insulating film.

8. The device according to claim 1, wherein
the second insulating film has substantially a film thickness same as a thickness of the first insulating film.

9. The device according to claim 1, wherein
each of the plurality of second control electrode includes a material same as a material of the first control electrode.

10. The device according to claim 1,
wherein
the plurality of second electrodes is connected to the plurality of fourth semiconductor layers, respectively.

11. The device according to claim 10, wherein
the plurality of second control electrodes includes a third second-control electrode, the second second-control electrode being provided between the first second-control electrode and the third second-control electrode.

\* \* \* \* \*